United States Patent [19]

Muterspaugh

[11] Patent Number: 4,646,360

[45] Date of Patent: Feb. 24, 1987

[54] CONSTANT BANDWIDTH RF FILTER WITH IMPROVED LOW FREQUENCY ATTENUATION

[75] Inventor: Max W. Muterspaugh, Indianapolis, Ind.

[73] Assignee: RCA Corporation, Princeton, N.J.

[21] Appl. No.: 815,135

[22] Filed: Dec. 31, 1985

Related U.S. Application Data

[63] Continuation of Ser. No. 587,117, Mar. 7, 1984, abandoned.

[51] Int. Cl.⁴ .......................... H04B 1/26; H03H 7/01
[52] U.S. Cl. ..................................... 455/195; 455/191; 455/197; 455/340; 334/15; 333/174
[58] Field of Search .............. 455/191, 193, 195, 197, 455/261, 262, 289, 291, 340, 341, 169; 334/15; 333/174; 330/302, 305; 331/177 V; 358/195.1

[56] References Cited

U.S. PATENT DOCUMENTS

| | | |
|---|---|---|
| 3,354,397 | 11/1967 | Wittig .................................. 334/15 |
| 3,582,823 | 6/1971 | Pasos .............................. 331/177 V |
| 3,628,152 | 12/1971 | Carlson . |
| 3,646,449 | 2/1972 | Hellbarth et al. . |
| 3,684,977 | 8/1972 | Viles ....................................... 334/15 |
| 3,693,096 | 9/1972 | Dosey et al. . |
| 3,825,858 | 7/1974 | Amemiya et al. ................... 455/262 |
| 4,061,981 | 12/1977 | Endres et al. ....................... 455/169 |
| 4,075,580 | 2/1978 | Sunkler ............................. 331/177 V |
| 4,186,350 | 1/1980 | Takayama . |

*Primary Examiner*—Jin F. Ng
*Attorney, Agent, or Firm*—Paul J. Rasmussen; Peter M. Emanuel; Adel A. Ahmed

[57] ABSTRACT

A television tuner has a tuned circuit at the input of an RF amplifier. The tuned circuit has a varactor tuned parallel circuit and an output series coil for good high frequency attenuation and constant bandwidth with changes in frequency. For good low frequency attenuation, an input series capacitance is provided comprising a pair of varactors. The varactor pair is oppositely poled to reduce frequency doubling of low frequency signals.

10 Claims, 2 Drawing Figures

CONSTANT BANDWIDTH RF FILTER WITH IMPROVED LOW FREQUENCY ATTENUATION

This is a continuation of application Ser. No. 587,117 filed Mar. 7, 1984, now abandoned.

The present invention relates to radio frequency (RF) filters, and more particularly to tuned circuits used in television receivers.

Frequency selective tuned circuits are used before and after the RF amplifying stage of television receivers. In modern receivers these circuits employ voltage variable capacitance diodes (varactors) for electronic tuning. If simple parallel tuned circuits using varactors in shunt with a coil are used in conjunction with a constant load resistance, then, as the varactor capacitance changes in accordance with a tuning voltage applied thereto, the bandwidth becomes larger as the tuning frequency increases. This is undesirable as the possibility of interference from channels adjacent the desired channel increases.

One solution to this problem is shown in U.S. Pat. No. 3,628,152. In the arrangement shown therein, a pair of coils are placed in series with the source and load, respectively, and a parallel varactor controlled tuned circuit is coupled between said coils and ground. The coils cause the equivalent resistance of the antenna and RF amplifier in parallel with the tuned circuit to increase as frequency increases. This causes the Q of the entire circuit to increase as frequency increases, thereby maintaining substantially constant bandwidth with increases in frequency of the tuned circuit. However, this arrangement suffers from inadequate attentuation at frequencies below the resonant frequency of the tuned circuit. In particular, low frequency attenuation values of from 5-15 db are obtained, thereby increasing the chance of lower adjacent channel interference. Further, if large enough in amplitude, the low frequency signals can cause varactor capacitance changes so that the varactors operate to multiply the frequencies of the low frequency signals. In this case, the second harmonic of the low frequency signals have been found to be the strongest. Thus, signals having a frequency of one-half the selected frequency are especially prone to cause interference. To partially overcome this problem, a high pass filter (HPF) can be used ahead of the tuned circuit. Typically, the HPF comprises several components and includes a trap tuned to the "Citizens Band" at 27 MHz, which frequency can be otherwise doubled by the tuned circuit to produce an interference signal for channel 2 at 54 MHz. The HPF is expensive due to the number of components involved and does not solve the interference problem created when strong low frequency signals other than at 27 MHz are present.

In accordance with the principles of the present invention, a tuned circuit with an output series coil has a capacitance element in series with the source in order to provide good low frequency attenuation. As a further aspect of the invention, the capacitance element comprises a pair of varactors poled in opposite directions so that low frequency signals cause substantially equal and opposite capacitance changes in the varactors, whereby substantially no net capacitance change occurs, thereby reducing the possibility of frequency multiplication. The invention can be used at the input of a television RF amplifying stage.

DETAILED DESCRIPTION

Figure 1:
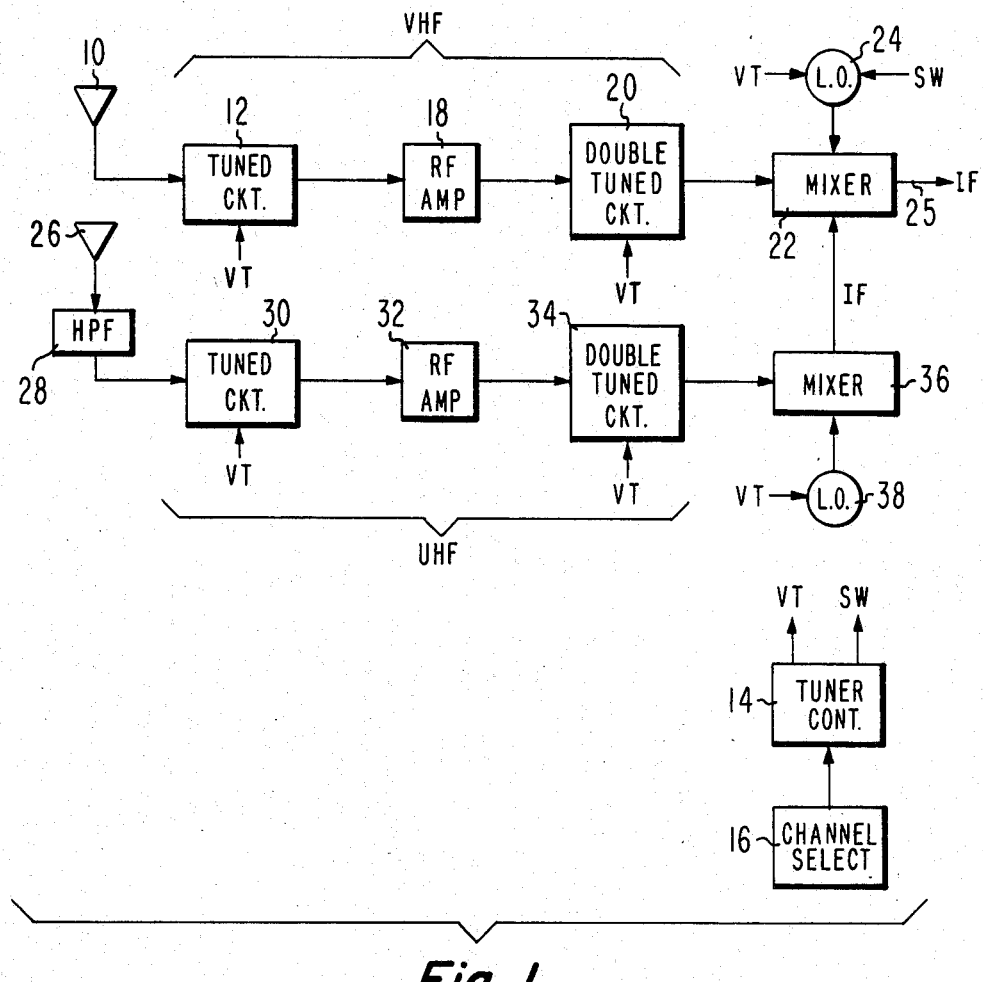
FIG. 1 is a block diagram of the tuner portion of a television receiver which may employ the tuned circuit constructed according to the present invention.

FIG. 1 shows VHF antenna 10 supplying signals to tuned circuit 12 constructed in accordance with the present invention and described in detail below with reference to FIG. 2. Circuit 12 receives a tuning voltage VT from tuner control circuit 14, which circuit 14 is, in turn, controlled by a channel selection circuit 16. Voltage VT determines which one of the RF signals corresponding to VHF television channels is selected by circuit 12 and applied to VHF RF amplifier 18. The amplified output signal from amplifier 18 is applied to tuned circuit 20, which desirably is of the double tuned type in order to provide sufficient image rejection. The resonant frequency of circuit 20 is also controlled by VT and the output signal thereof is applied to mixer 22. The output signal from local oscillator (LO) 24 is applied to mixer 22 and has its frequency controlled by VT to be in the range 101-257 MHz for channels 2-13, respectively, so that mixer 22 provides at output 25 an IF signal in the 41-47 MHz range, which is the conventional intermediate frequency (IF) range in the United States. The IF signal at the output of mixer 22 is then applied to conventional IF and baseband circuits (not shown) of the receiver for picture and sound processing.

For UHF operation, UHF antenna 26 applies UHF signals to high pass filter (HPF) 28 having a cutoff frequency of about 450 MHz just below the UHF range in the United States. The filtered output signals from HPF 28 are applied to conventional varactor tuned circuit 30, having a frequency controlled by VT. Circuit 30 selects a UHF channel signal and applies it to UHF RF amplifier 32. The amplified signal is then applied to double tuned circuit 34 having a frequency controlled by VT. The UHF signal is then applied to mixer 36. LO 38 provides a signal to mixer 36 having a frequency of 517-931 MHz for channels 14-83 so that mixer 36 provides an output signal to mixer 22 having a frequency range of 41-47 MHz. During UHF operation, tuner control circuit 14 provides a bandswitching signal SW to LO 24 in order to disable it. Also, during UHF operation mixer 22 functions as a 41-47 MHz amplifier.

Figure 2:
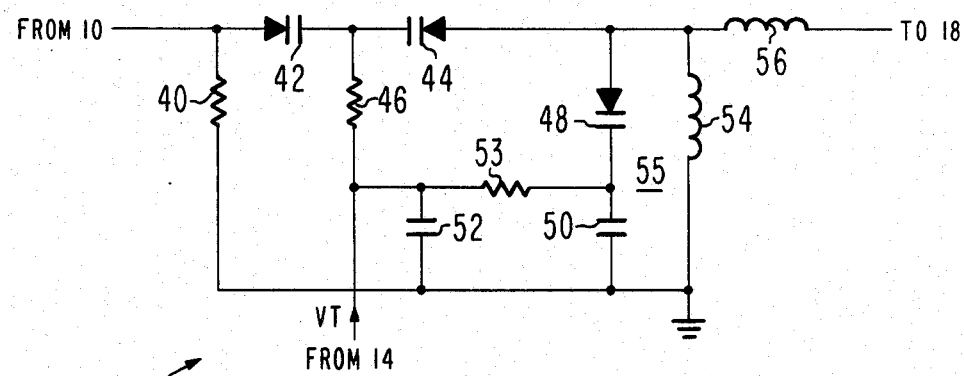
FIG. 2 is a schematic diagram of a tuned circuit constructed in accordance with the present invention.

FIG. 2 shows the details of tuned circuit 12. The VHF signals from antenna 10 are applied to the anode of varactor 42 and resistor 40, which resistor provides a ground return for the anode of varactor 42, but has a high enough value to avoid significant attenuation of the RF input signal. The cathode of varactor 42 is coupled to the cathode of varactor 44, i.e., varactors 42 and 44 are oppositely poled. The anode of varactor 44 is coupled to the anode of varactor 48, the cathode of which is coupled to ground by capacitor 50 selected to have negligible impedance in the VHF range. Preferably, varactors 42, 44 and 48 are matched so that, e.g., for any given voltage VT their capacitance is equal within about one percent. Voltage VT is applied through RF isolation resistor 46 to the cathodes of varactors 42 and 44 and through RF isolation resistor 53 to the cathode of varactor 48. Capacitor 52 couples the junction of resistors 46 and 53 to ground and has a value selected to present negligible impedance in the VHF range. Inductor or coil 54 forms a parallel tuned circuit 55 with varactor 48. Inductor 56 is series coupled between parallel tuned circuit 55 and RF amplifier 18.

In operation, as the selected channel increases in frequency, the voltage VT increases, thus causing a greater degree of back biasing (lower capacitance) of varactors 42, 44 and 48. This causes circuit 12 to resonate at progressively higher frequencies. Coil 56 serves to transform the input impedance of RF amplifier 18 into an increasingly higher (with increases in frequency) equivalent load resistance in parallel with tuned circuit 55 in order to increase the Q of circuit 12 and thus help maintain constant bandwidth. Coil 56 also attenuates high frequency signals since its series reactance increases with increasing frequency.

Varactors 42 and 44 transform the resistance of antenna 10 to help maintain constant bandwidth. It might be thought that the series capacitance provided by varactors 42 and 44 cannot transform the antenna 10 resistance into an increasingly higher parallel equivalent resistance to help maintain constant bandwidth since a series reactance that increases with frequency is required and capacitive reactance decreases with frequency increases. However, this is not correct as will now be explained. If VT, by increasing, causes the capacitance of each of varactors 42, 44 and 48 to become one quarter of original value, then the resonant frequency of circuit 12 doubles since the resonant frequency is inversely proportional to the square root of their equivalent capacitance (which is the capacitance of varactor 42 and 44 in series with each other and their combination in parallel with varactor 48). Since capacitive reactance varies inversely with both frequency and capacitance and the capacitance is one quarter of an initial value if the frequency doubles, the reactance of varactors 42 and 44 doubles with a doubling in resonant frequency of circuit 12 i.e., their reactance increases proportionally with frequency. This causes the equivalent resistance of antenna 10 in parallel with circuit 55 to increase with increases in frequency in order to also help maintain constant bandwidth. Specifically, the equivalent parallel resistances of both amplifier 18 and antenna 10 are proportional to frequency and thus the Q of circuit 12 is proportional to frequency.

The net result of the above effects is that since bandwidth is proportional to the resonant frequency and inversely proportional to Q, the bandwidth of circuit 12 does not substantially vary with its resonant frequency. The formula for the bandwidth is:

$$\frac{1}{2\pi}\left(\frac{1}{(3/2)CL}\right)\left(R_S \frac{C}{2} \cdot \frac{1}{3L} + \frac{R_L(3/2)CL}{L_2^2}\right)$$

Wherein $R_S$ and $R_L$ are the resistances of antenna 10 and amplifier 18 respectively, C is the capacitance of each of the matched varactors, L is the inductance of the parallel combination of coils 54 and 56 and $L_2$ is the inductance of coil 56. It will be noted that all of the "C" terms in the above equation cancel out. Thus the bandwidth is not only independent of the resonant frequency of circuit 12 but also independent of the capacitance of the varactors.

In general, the equivalent parallel resistances of antenna 10 and amplifier 18 should be equal (matched) for minimum loss. This can be accomplished by selection of the values for coil 56 and varactors 42 and 44. If the resistances of antenna 10 and amplifier 18 are equal, then the reactances of coil 56 and the series combination of varactors 42 and 44 are chosen to be equal.

Varactors 42 and 44 (due to their increasing series reactance as frequency decreases) together with inductor 54 (due to its decreasing shunt reactance as frequency decreases) provide good low frequency attenuation for a more symmetrical frequency response. In particular, attenuation at one half the resonant frequency of circuit 12 has been found to be about 20-30 db for the values indicated below. Further, for low frequencies, substantially all of the input voltage is developed across varactors 42 and 44 with only a small low frequency voltage developed across varactor 48. Therefore, any capacitance changes of the varactor diodes are substantially cancelled out in the series circuit formed by varactors 42 and 44 due to their being oppositely poled. I.e., as the capacitance of one of varactors 42 and 44 increases, the other one decreases so there is essentially no net capacitance change in the circuit. Thus, frequency doubling is greatly reduced.

The following is a table of values for the circuit of FIG. 2 for the case when antenna 10 and amplifier 18 have 50 ohm resistances and when an approximately 10 MHz bandwidth is desired:

| Element | Value |
| --- | --- |
| 40, 46, 53 | 10,000 ohms |
| 50, 52 | 0.01 μF |
| 42, 44, 58 | BB329A manufactured by ITT |
| 54 | 220 nH |
| 56 | 500 nH |

It will be appreciated that modifications can be made that are within the scope of the invention. E.g., RF chokes can replace resistors 46 and 53. In this case however, there may be a parasitic resonance problem due to interturn capacitance of the chokes. Further, although the invention has been described in conjunction with a single conversion tuner, it may be used in a double conversion tuner. Further, the circuit of FIG. 2 can be used as the UHF tuned circuit 30 with appropriate component values, thereby eliminating HPF 28. However, it may be difficult to obtain varactors with the appropriate capacitances. In this case, an inductor in parallel with the varactors 42 and 44 can be used to lower the net effective capacitance. When used in the UHF portion of the tuner, the loss of tuned circuit loss has been found to be about 3 db as compared with less than 1 db for the VHF version described above.

What is claimed is:

1. A circuit coupled between a source and a load, said circuit comprising:
 a first coil having a first end coupled to a point of reference potential and having a second end;
 a first varactor having a first end coupled to said point of reference potential and having a second end coupled to said second end of said first coil at a junction for forming a parallel tuned circuit;
 a second coil having a first end coupled to said junction and a second end coupled to said load and having substantially no mutual inductive coupling to said first coil;

a second varactor having a first end coupled to said junction and a second end coupled to said source; and means for applying a tuning voltage to said varactors.

2. A circuit as claimed in claim 1, further comprising a third varactor coupled in series with said second varactor and poled opposite thereto, said applying means also applying said tuning voltage to said third varactor.

3. A circuit as claimed in claim 2, wherein said varactors have substantially the same capacitance for the same tuning voltage and substantially the same tuning voltage is applied to all of said varactors.

4. A television tuner comprising:
an RF input for receiving RF signals;
a tuned circuit coupled to said RF input;
an RF amplifier having an input impedance and being coupled to said tuned circuit;
a mixer coupled to said RF amplifier; and
a local oscillator coupled to said mixer;
said tuned circuit comprising a parallel resonant circuit coupled between a circuit point and a point of reference potential, a coil coupled in series between said circuit point and said RF amplifier for transforming said input impedance into an equivalent load resistance in parallel with said parallel resonant circuit such that said equivalent load resistance exhibits an increasingly higher value with increases of frequency, said coil having substantially no mutual inductive coupling to said parallel resonant circuit, and variable capacitance means having a first end coupled to said circuit point and a second end coupled to receive said RF signals.

5. A tuner as claimed in claim 4, further comprising a further tuned circuit coupled between said RF amplifier and said mixer.

6. A tuner as claimed in claim 4, wherein said resonant circuit comprises a first varactor and said capacitance means comprises a second varactor, and further includes means for applying a tuning voltage to said varactors.

7. A tuner as claimed in claim 6, wherein said capacitance means further comprises a third varactor series coupled to said second varactor and poled opposite thereto, said applying means applying said tuning voltage to said third varactor.

8. A tuner as claimed in claim 7, wherein said varactors have substantially the same capacitance for the same tuning voltage and substantially the same tuning voltage is applied to all of said varactors.

9. A television tuner comprising:
a radio frequency (RF) input for receiving RF signals;
a tuned circuit coupled to said RF input;
an RF amplifier having an input coupled to said tuned circuit and exhibiting a predetermined input impedance;
a mixer coupled to said RF amplifier; and
a local oscillator coupled to said mixer;
said tuned circuit comprising a parallel resonant circuit coupled between a circuit point and a point of reference potential, frequency-dependent coupling means coupled between said circuit point and said input of said RF amplifier for transforming said predetermined input impedance of said RF amplifier into an equivalent impedance in parallel with said parallel resonant circuit so as to increase the Q of said tuned circuit, said equivalent impedance exhibiting an increasingly higher value for increasing frequency so as to reduce a frequency-dependent variation of bandwidth in said tuned circuit, and variable capacitance means having a first end coupled to said circuit point and a second end coupled to receive said RF signals.

10. A tuner as claimed in claim 9 wherein said frequency-dependent coupling means comprises a coil coupled in series between said circuit point and said input of said RF amplifier so as to attenuate signals having a substantially higher frequency than the resonant frequency of said parallel tuned circuit.

* * * * *